United States Patent
Tomita et al.

(10) Patent No.: US 7,597,511 B2
(45) Date of Patent: Oct. 6, 2009

(54) SURFACE-COATED CUTTING TOOL WITH HARD COATING LAYER HAVING EXCELLENT ABRASION RESISTANCE

(75) Inventors: Kouhei Tomita, Naka (JP); Michiyasu Nishiyama, Naka (JP); Akira Osada, Naka (JP); Eiji Nakamura, Naka (JP)

(73) Assignee: Mitsubishi Materials Corporation, Tokyo (JP)

( * ) Notice: Subject to any disclaimer, the term of this patent is extended or adjusted under 35 U.S.C. 154(b) by 0 days.

(21) Appl. No.: 12/343,987

(22) Filed: Dec. 24, 2008

(65) Prior Publication Data

US 2009/0170415 A1 Jul. 2, 2009

(30) Foreign Application Priority Data

Dec. 28, 2007 (JP) .............................. 2007-338865
Jun. 19, 2008 (JP) .............................. 2008-160053

(51) Int. Cl.
*B23B 27/14* (2006.01)
*B23B 27/00* (2006.01)

(52) U.S. Cl. .......................... 407/119; 407/113; 51/307; 428/212

(58) Field of Classification Search ......... 407/113–116, 407/119; 51/307, 309; 428/212, 698, 65.6
See application file for complete search history.

(56) References Cited

U.S. PATENT DOCUMENTS

| | | | | |
|---|---|---|---|---|
| 5,766,782 A | * | 6/1998 | Ljungberg | ................. 428/698 |
| 6,299,658 B1 | * | 10/2001 | Moriguchi et al. | ............ 51/307 |
| 6,713,172 B2 | * | 3/2004 | Ljungberg et al. | .......... 428/325 |
| 7,422,806 B2 | * | 9/2008 | Osada | ........................ 428/698 |
| 7,442,433 B2 | | 10/2008 | Honma et al. | |
| 2006/0188747 A1 | | 8/2006 | Honma et al. | |

FOREIGN PATENT DOCUMENTS

| | | |
|---|---|---|
| JP | 06-8010 A | 1/1994 |
| JP | 2006-198735 A | 8/2006 |
| JP | 2006-289557 A | 10/2006 |

* cited by examiner

*Primary Examiner*—Willmon Fridie
(74) *Attorney, Agent, or Firm*—Darby & Darby P.C.

(57) ABSTRACT

In a surface-coated cutting tool, (a) a Ti compound layer as a lower layer and (b) an α-type $Al_2O_3$ layer as an upper layer having a crystal grain structure of an even polygonal shape (including an even hexagonal shape) and an elongate shape and containing Zr are deposited on the surface of a tool substrate. In the surface-coated cutting tool, the above mentioned crystal grains of which insides are divided by at least one crystal lattice interface with the constituent atom covalent lattice point type expressed by $\Sigma 3$ occupying 60% or more as an area ratio in the crystal grains of the upper layer.

2 Claims, 3 Drawing Sheets

SURFACE-COATED CUTTING TOOL WITH HARD COATING LAYER HAVING EXCELLENT ABRASION RESISTANCE

BACKGROUND OF THE INVENTION

1. Field of the Invention

The present invention relates to a surface-coated cutting tool (hereinafter, referred to as a coated tool) of which a hard-coating layer exhibits excellent abrasion resistance for a long time without becoming chipped during high-speed heavy cutting of steel, cast iron, etc. in which high-temperature heat is emitted and a heavy load is applied to the cutting edges.

Priority is claimed on Japanese Patent Application No. 2007-338865, filed Dec. 28, 2007, and Japanese Patent Application No. 2008-160053, filed Jun. 19, 2008, the content of which are incorporated herein by reference.

2. Description of Related Art

In the past, a coated tool was known, which is generally formed by coating a surface of a substrate (hereinafter, generally referred to as a tool substrate) made of tungsten carbide (hereinafter, referred to as WC)-based cemented carbide or titanium carbonitride (hereinafter, referred to as TiCN)-based cermet with a hard-coating layer including a Ti compound layer as a lower layer and an $\alpha$-type $Al_2O_3$ layer as an upper layer. In the coated tool, electron beams are radiated to the individual crystal grains existing within a measurable range of a polished surface by the use of a field emission scanning electron microscope and an electron backscatter diffraction imaging device to measure angles formed by normal lines of crystal lattice faces with hexagonal crystal lattices and the normal line of the polished surface. A crystallographic orientation relationship between the adjacent crystal lattices is calculated from the measurement result, and a distribution of lattice points (constituent atom covalent lattice points) in which constituent atoms of an interface share one constituent atom between the crystal grains is calculated. When a constituent atom covalent lattice point type in which N lattice points not sharing the constituent atom exist between the constituent atom covalent lattice points (where N is an even number of 2 or more in view of a crystal structure of corundum type hexagonal close packed crystal but does not include even numbers of 4, 8, 14, 24, and 26 when the upper limit of N is set to 28 in view of distribution frequency) is expressed as $\Sigma N+1$, the upper layer is formed of the $\alpha$-type $Al_2O_3$ layer in which the peak exists at $\Sigma 3$ in a constituent atom covalent lattice point distribution graph indicating a distribution ratio of individual $\Sigma N+1$ to the total $\Sigma N+1$ and which satisfies the constituent atom covalent lattice point distribution graph of which the distribution ratio of individual $\Sigma 3$ to the total $\Sigma N+1$ is 60% to 80%. It is known that the coated tool exhibits excellent abrasion resistance in a high-speed intermittent cutting process.

A coated tool (hereinafter, referred to as "conventional coated tool") in which the upper layer in the above-mentioned coated tool is formed of an $\alpha$-type $(Al,Zr)_2O_3$ layer (hereinafter, referred to as "conventional AlZrO layer") containing a small amount of Zr is also known. It is also known that the conventional coated tool exhibits excellent chipping resistance in a high-speed intermittent cutting process, similarly to the above-mentioned coated tool.

Such a conventional coated tool is disclosed in JP-A-2006-198735 and JP-A-2006-289557.

In recent years, the performance of a cutting device has been remarkably enhanced, and demands for labor saving and energy saving in a cutting work and cost reduction have been increased. Accordingly, the cutting work is more often carried out in a higher speed range. The upper layer of the conventional coated tool has excellent high-temperature strength and excellent impact resistance. Accordingly, when the conventional coated tool is used in the continuous cutting or intermittent cutting work, it is possible to prevent chipping from occurring. However, the $\alpha$-type $Al_2O_3$ layer and the conventional AlZrO layer of the upper layer of the hard-coating layer do not satisfy the high-temperature strength and the surface properties. Accordingly, when the conventional cutting tool is used in heavy cutting work under the condition of higher speed, chipping easily occurs in the hard-coating layer and plastic deformation and uneven abrasion also easily occur. Actually, the abrasion resistance is deteriorated for these reasons, thereby shortening the usable life thereof.

SUMMARY OF THE INVENTION

From the above-mentioned point of view, the inventors have conducted studies on the structure of the upper layer exhibiting excellent abrasion resistance over long-term use without chipping occurring, or breakage, and peeling occurring in the hard-coating layer in higher-speed cutting work, and have obtained the following results.

(a) As the upper layer of the conventional AlZrO layer of the conventional coated tool, a film of Al—Zr composite oxide nucleus (hereinafter, referred to as "AlZrO nucleus") satisfying a composition expression of $(Al_{1-X}Zr_X)_2O_3$, (where X is in the range of 0.003 to 0.05 in an atomic ratio) and having an average layer thickness of 20 to 200 nm (0.02 to 0.2 μm) was formed on the surface of the Ti compound layer as the lower layer as a first step by the use of a conventional chemical vapor deposition apparatus under the conditions of:

Composition of reaction gas (in volume %):

$AlCl_3$: 2.3 to 4%, $ZrCl_4$: 0.02 to 0.13%, $CO_2$: 1 to 5%, HCl: 1.5 to 3%, $H_2S$: 0.05 to 0.2%, and $H_2$: balance;

Temperature of reaction atmosphere: 750 to 900° C.; and

Pressure of reaction atmosphere: 6 to 10 kPa. Subsequently, in a state where the AlZrO nucleus film is heated under the conditions that the heating atmosphere is changed to a hydrogen atmosphere with a pressure of 3 to 13 kPa and the temperature of the heating atmosphere is changed to 1100° C. to 1200° C., a vapor deposition process is performed as a second step under the conditions of:

Composition of reaction gas (in volume %):

$AlCl_3$: 2.3 to 4%, $ZrCl_4$: 0.02 to 0.13%, $CO_2$: 3 to 8%, HCl: 1.5 to 3%, $H_2S$: 0.05 to 0.2%, and $H_2$: balance;

Temperature of reaction atmosphere: 1020 to 1050° C.; and

Pressure of reaction atmosphere: 6 to 10 kPa.

As a result, the conventional AlZrO layer having a composition in which the content of Zr in the total contents of Al and Zr is in the range of 0.003 to 0.05 (in atomic ratio) was formed. When the conventional AlZrO layer is observed with a field emission scanning electron microscope, the conventional AlZrO layer has a structure including crystal grains having a fine polygonal shape in the plane perpendicular to the thickness direction as shown in FIG. 2A and an elongate shape in the thickness direction with pyramidal unevenness in the layer surface (hereinafter, referred to as "uneven polygonal elongate shape") in the plane parallel to the thickness direction as shown in FIG. 2B.

(b) On the other hand, a first vapor deposition process was performed on the Ti compound layer as the lower layer of the hard-coating layer by the use of a conventional chemical vapor deposition apparatus under the conditions of:

(1) Composition of reaction gas (in volume %):

$AlCl_3$: 1 to 5%, $CO_2$: 2 to 6%, HCl: 1 to 5%, $H_2S$: 0.25 to 0.75%, and $H_2$: balance;

(2) Temperature of reaction atmosphere; 960 to 1010° C.; and (3) Pressure of reaction atmosphere: 6 to 10 kPa. Thereafter, a second vapor deposition process was performed thereon under the conditions of:
(1) Composition of reaction gas (in volume %):
AlCl$_3$: 6 to 10%, ZrCl$_4$: 0.6 to 1.2%, CO$_2$: 4 to 8%, HCl: 3 to 5%, H$_2$S: 0.25 to 0.6%, and H$_2$: balance;
(2) Temperature of reaction atmosphere: 920 to 1000° C.; and
(3) Pressure of reaction atmosphere: 6 to 10 kPa. As a result, the upper layer formed of an α-type aluminum oxide layer (hereinafter, referred to as "reformed AlZrO layer") containing Zr with an average layer thickness of 2 to 15 μm was formed. The reformed AlZrO layer formed under the above-mentioned conditions has a composition in which the content of Zr in the total contents of Al and Zr in the layer is in the range of 0.002 to 0.01 (in atomic ratio).

(c) The reformed AlZrO layer was observed with a field emission scanning electron microscope. The reformed AlZrO layer has a structure with crystal grains having an even polygonal shape with a large particle size in the plane perpendicular to the thickness direction as shown in FIG. 1A and an elongate shape in the thickness direction with an even surface (hereinafter, referred to as "even polygonal elongate shape") in the plane parallel to the thickness direction as shown in FIG. 1B.

Particularly, in vapor deposition of the reformed AlZrO layer, the vapor deposition process was performed under more limited vapor deposition conditions (for example, the conditions where H$_2$S contained in the reaction gas is in the range of 0.50 to 0.75 vol % and the temperature of the reaction atmosphere is in the range of 980 to 1000° C. in the first step, and the conditions that ZrCl$_4$ contained in the reaction gas is in the range of 0.6 to 0.9 vol %, H$_2$S contained in the reaction gas is in the range of 0.25 to 0.4 vol %, and the temperature of the reaction atmosphere is in the range of 960 to 980° C. in the second step). As a result, as shown in FIG. 1C, the crystal grains have an even hexagonal shape with a large particle size in the plane perpendicular to the thickness direction. The layer surface is almost even and the crystal grains have a elongate shape in the thickness direction as shown in FIG. 1B in the plane parallel to the thickness direction. A structure in which such crystal gains occupy 35% or more of the total area in the plane perpendicular to the thickness direction was formed.

In the reformed AlZrO layer, electron beams were radiated to the individual crystal grains existing within a measurable range of a polished surface by the use of a field emission scanning electron microscope and an electron backscatter diffraction imaging device to measure angles formed by normal lines of crystal lattice faces with hexagonal crystal lattices and the normal line of the polished surface. A crystallographic orientation relationship between the adjacent crystal lattices was calculated from the measurement result and a distribution of lattice points (constituent atom covalent lattice points) in which constituent atoms of a crystal lattice interface share one constituent atom between the crystal lattices was calculated. When a constituent atom covalent lattice point type in which N lattice points not sharing the constituent atom exist between the constituent atom covalent lattice points (where N is an even number of 2 or more in view of a crystal structure of corundum type hexagonal close packed crystal but does not include even numbers of 4, 8, 14, 24, and 26 when the upper limit of N is set to 28 in view of distribution frequency) is expressed as ΣN+1, the insides of the crystal grains occupying 60% or more as an area ratio in the even polygonal elongate crystal grains of the reformed AlZrO layer were divided by at least one crystal lattice interface (hereinafter, referred to as "Σ3 coincidence site lattice interface") with the constituent atom covalent lattice point type expressed by Σ3 as shown in FIG. 3.

(d) In the upper layer formed of the reformed AlZrO layer formed under the chemical vapor deposition conditions (hereinafter, referred to as "condition of the invention") of the first and second steps described in the (b), the crystal face of the surface has the same orientation as the crystal face (for example, (0001)) in the plane perpendicular to the thickness direction. Accordingly, (as viewed in the plane parallel to the thickness direction), the layer surface had an almost even plate shape and exhibited excellent chipping resistance due to the surface structure. Since the strength in the crystal grains can be enhanced due to the existence of the Σ3 coincidence site lattice interface in the crystal grains having the even polygonal elongate shape, more excellent high-temperature hardness, high-temperature strength, and surface structure were obtained than those of the conventional AlZrO layer of the conventional coated tool. As a result, the reformed AlZrO layer according to the invention exhibits excellent abrasion resistance for a long time without causing chipping, breakage, and peeling during a high-speed heavy cutting work in which a heavy load is applied to cutting edges with high-temperature heat.

The invention has been achieved based on the above study results.

(1) According to an aspect of the invention, there is provided a surface-coated cutting tool (coated tool) that is formed by coating a surface of a tool substrate made of tungsten-carbide-based cemented carbide or titanium-carbonitride-based cermet with a hard-coating layer including the following upper and lower layers (a) and (b) by vapor deposition:

(a) as the lower layer, a titanium compound layer having at least one or more of a titanium carbide layer, a titanium nitride layer, a titanium carbonitride layer, a titanium carboxide layer and a titanium oxycarbonitride layer with a total average layer thickness of 3 to 20 μm, and (b) as the upper layer; an aluminum oxide layer having an α-type crystal structure and containing Zr with an average layer thickness of 2 to 15 μm, wherein when the upper layer is observed with a field emission scanning electron microscope, the upper layer has a structure including crystal grains having an even polygonal shape in a plane perpendicular to the thickness direction and an elongate shape in the thickness direction in a plane parallel to the thickness direction, and wherein when electron beams are radiated to the individual crystal grains existing within a measurable range of a polished surface by the use of the field emission scanning electron microscope and an electron backscatter diffraction imaging device to measure angles formed by normal lines of crystal lattice faces including hexagonal crystal lattices and the normal line of the polished surface, a crystallographic orientation relationship between the adjacent crystal lattices is calculated from the measurement result, a distribution of lattice points (constituent atom covalent lattice points) in which constituent atoms of a crystal lattice interface share one constituent atom between the crystal lattices is calculated, and a constituent atom covalent lattice point type in which N lattice points not sharing the constituent atom exist between the constituent atom covalent lattice points (where N is an even number of 2 or more in view of a crystal structure of corundum type hexagonal close packing crystal but does not include even numbers of 4, 8, 14, 24, and 26 when the upper limit of N is set to 28 in view of distribution frequency) is expressed as ΣN+1, the above mentioned crystal grains of which insides are divided by at least one crystal lattice interface with the constituent atom covalent lattice point type expressed by Σ3 occupying 60% or more as an area ratio in the crystal grains of the upper layer.

(2) In the surface-coated cutting tool (coated tool), when the upper layer (b) is observed with the field emission scanning electron microscope, the crystal grains having an even polygonal shape in a plane perpendicular to the thickness direction and an elongate shape in the thickness direction in a plane parallel to the thickness direction occupy 35% or more as an area ratio in the entire plane perpendicular to the thickness direction.

Constituent layers of the hard-coating layer of the coated tool according to the invention will be described below in detail.

(a) Lower Layer (Ti Compound Layer)

The Ti compound layer having at least one or more of a titanium carbide layer, a titanium nitride layer, a titanium carbonitride layer, a titanium carboxide layer and a titanium oxycarbonitride layer is disposed as the lower layer of the hard-coating layer. The Ti compound layer contributes to improvement in high-temperature strength of the hard-coating layer due to its excellent high-temperature strength and is also strongly adhered to any of the tool substrate and the reformed AlZrO layer. Accordingly, the Ti compound layer has a function of improving the bonding strength of the hard-coating layer to the tool substrate. However, when the average layer thickness is less than 3 μm, the function cannot be satisfactorily performed. When the average layer thickness is greater than 20 μm, the plastic deformation can easily occur particularly in the high-speed cutting work with high-temperature heating, which causes uneven abrasion. Accordingly, the average layer thickness is determined to be in the range of 3 to 20 μm.

(b) Upper Layer (Reformed AlZrO Layer)

In the upper layer formed of the reformed AlZrO layer chemically deposited on the lower layer, the Al component improves the high-temperature hardness and the heat resistance of the layer. The Zr component minutely contained in the layer (where the Zr/(Al+Zr) as a ratio to the total contents of Al and Zr is in the range of 0.002 to 0.01 (in atomic ratio) improves the strength of the crystal grain boundary of the reformed AlZrO layer and contributes to the improvement in high-temperature strength. However, when the content of Zr is less than 0.002, the above-mentioned functions cannot be expected. When the content of Zr is greater than 0.01, particles of $ZrO_2$ are extracted in the layer, thereby reducing the crystal grain strength. Accordingly, it is preferable that the content of Zr (the value of Zr/(Al+Zr)) in the total contents of Al and Zr be in the range of 0.002 to 0.01 (in atomic ratio).

The reformed AlZrO layer can be foamed by adjusting the chemical vapor deposition conditions such as the composition of a reaction gas, the temperature of a reaction atmosphere, and the pressure of the reaction atmosphere as described below.

That is, the first vapor deposition process is performed for about one hour under the conditions of:

(1) Composition of reaction gas (in volume %):
$AlCl_3$: 1 to 5%, $CO_2$: 2 to 6%, HCl: 1 to 5%, $H_2S$: 0.25 to 0.75%, and $H_2$: balance;
(2) Temperature of reaction atmosphere: 960 to 1010° C.; and
(3) Pressure of reaction atmosphere: 6 to 10 kPa. Thereafter, the second vapor deposition process is performed under the conditions of:
(1) Composition of reaction gas (in volume %):
$AlCl_3$: 6 to 10%, $ZrCl_4$: 0.6 to 1.2%, $CO_2$: 4 to 8%, HCl: 3 to 5%, $H_2S$: 0.25 to 0.6%, and $H_2$: balance;
(2) Temperature of reaction atmosphere: 920 to 1000° C.; and
(3) Pressure of reaction atmosphere: 6 to 10 kPa. As a result, the reformed AlZrO layer having the value of Zr/(Al+Zr) of 0.002 to 0.01 in an atomic ratio can be formed by forming a deposited layer with an average layer thickness of 2 to 15 μm.

The reformed AlZrO layer is observed with the field emission scanning electron microscope. As viewed in the plane perpendicular to tile thickness direction, the crystal grains have an even polygonal shape with a large grain size as shown in FIG. 1A. As viewed in the plane parallel to the thickness direction, a structure with crystal grains (even polygonal elongate crystal grains) having an elongate shape in the thickness direction and the almost even layer surface is obtained as shown in FIG. 1B. Thanks to the evenness of the layer surface of the reformed AlZrO layer, the chipping resistance is further improved than that of the conventional AlZrO layer having unevenness in the surface thereof.

Specifically, in vapor deposition of the reformed AlZrO layer, the vapor deposition process is performed under more limited vapor deposition conditions (for example, the condition that $H_2S$ contained in the reaction gas is in the range of 0.50 to 0.75 vol % and the temperature of the reaction atmosphere is in the range of 980 to 1000° C. in the first step, and the condition that ZrCl, contained in the reaction gas is in the range of 0.6 to 0.9 vol %, $H_2S$ contained in the reaction gas is in the range of 0.25 to 0.4 vol %, and the temperature of the reaction atmosphere is in the range of 960 to 980° C. in the second step). As a result as shown in FIG. 1C, the crystal grains have an even hexagonal shape with a large particle are as viewed in the plane perpendicular to the thickness direction. As shown in FIG. 1B, the layer surface is almost even as viewed in the plane parallel to the thickness direction. A structure in which the crystal grains having an elongate shape in the thickness direction occupy 35% or more of the total area in the plane perpendicular to the thickness direction is formed.

In the conventional AlZrO layer, the crystal face of the surface has an orientation (for example, (1-102)) different from the crystal face (for example, (0001)) in the plane perpendicular to the thickness direction. Accordingly, (as viewed in the plane parallel to the thickness direction) as shown in FIG. 2E, pyramidal unevenness exists in the layer surface and thus the chipping resistance is deteriorated.

In the reformed AlZrO layer, electron beams are radiated to the individual crystal grains existing within a measurable range of a polished surface by the use of the field emission scanning electron microscope and the electron backscatter diffraction imaging device to measure angles formed by normal lines of crystal lattice faces with hexagonal crystal lattices and the normal line of the polished surface. A crystallographic orientation relationship between the adjacent crystal lattices is calculated from the measurement result and a distribution of lattice points (constituent atom covalent lattice points) in which constituent atoms of a crystal lattice interface share one constituent atom between the crystal lattices is calculated. When a constituent atom covalent lattice point type in which N lattice points not sharing the constituent atom exists between the constituent atom covalent lattice points (where N is an even number of 2 or more in view of a crystal structure of corundum type hexagonal close packed crystal but does not include even numbers of 4, 8, 14, 24, and 26 when the upper limit of N is set to 28 in view of distribution frequency) is expressed as ΣN+1, it can be seen that the insides of the crystal grains occupying 60% or more as an area ratio in the even polygonal (including an even hexagon) elongate crystal grains of the reformed AlZrO layer are divided by at least one Σ3 coincidence site lattice interface as shown in FIG. 3.

The Σ3 coincidence site lattice interface exists in the even polygonal (including an even hexagon) elongate crystal grains of the reformed AlZrO layer. Accordingly, the strength of the crystal grains is improved. Consequently, cracks are prevented from occurring in the reformed AlZrO layer during the high-speed heavy cutting work. Even when the cracks occur, the growth and propagation of the cracks can be prevented, thereby improving the chipping resistance, the loss resistance, and the peeling resistance.

Therefore, the upper layer formed of the reformed AlZrO layer having the Σ3 coincidence site lattice interface in the even polygonal (including an even hexagon) elongate crystal grains and having the even surface structure exhibits excellent abrasion resistance for a long time without causing any chipping, breakage, and peeling, during the high-speed heavy cutting work on steel, cast iron, etc. in which high-temperature heat is emitted and a heavy load is applied to the cutting edges.

When the thickness of the upper layer formed of the reformed AlZrO layer is less than 2 μm, excellent characteristics of the upper layer cannot be satisfactorily exhibited. When the thickness of the upper layer is greater than 15 μm, thermoplastic deformation causing uneven abrasion easily occurs and chipping also easily occurs. Accordingly, the average thickness of the upper layer is determined to be in the range of 2 to 15 μm.

In the conventional coated tool of which the upper layer of the hard-coating layer is formed of the conventional AlZrO layer, the structure and the constituent atom covalent lattice point type of the crystal grains in the upper layer was measured by the use of the field emission scanning electron microscope and the electron backscatter diffraction imaging device. Since the structure of the crystal grains has the pyramidal unevenness shown in FIGS. 2A and 2B and includes the polygonal elongate grains, the abrasion resistance is not satisfactory in comparison with the reformed AlZrO layer.

In the constituent atom covalent lattice point type of the crystal grains, the area ratio of the crystal grains having the Σ3 coincidence site lattice interface in the uneven polygonal elongate crystal grains of the conventional AlZrO layer was 40% or less, which is small. Accordingly, the strength of the crystal grains was not improved. Accordingly, the convention coated tool in which the upper layer of the hard-coating layer is formed of the conventional AlZrO layer could not prevent chipping, breakage, and peeling from occurring during high-speed heavy cutting work in which a heavy load is applied to the cutting edges with high-temperature heat, and the abrasion resistance was not satisfactory.

As described above, in the coated tool according to the invention, the reformed AlZrO layer as the upper layer has a structure including even polygonal (including a hexagonal shape) elongate crystal grains with surface evenness. The Σ3 coincidence site lattice interface is formed in the crystal grains to enhance the strength of the crystal grains. Accordingly, in comparison with the conventional coated tool including the conventional AlZrO layer having the uneven polygonal elongate crystal grains and a small number of Σ3 coincidence site lattice interface in the crystal grains as the upper layer, excellent high-temperature strength and excellent abrasion resistance are accomplished in addition to the high-temperature hardness and the heat resistance of the conventional AlZrO layer. As a result, the hard-coating layer exhibits excellent chipping resistance, excellent breakage resistance, excellent peeling resistance, and excellent abrasion resistance during high-speed heavy cutting work on steel, cast iron, etc. in which high-temperature heat is emitted and a heavy load is applied to the cutting edges, thereby elongating the usable lifetime.

DETAILED DESCRIPTION OF THE INVENTION

Figure 1A:
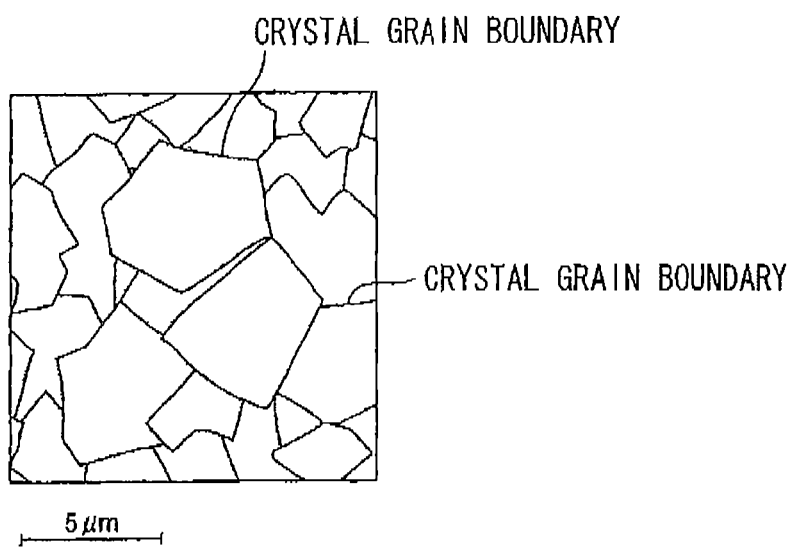
FIG. 1A is a diagram schematically illustrating a structure of even polygonal crystal grains, which is obtained by observing an upper layer formed of a reformed AlZrO layer in a coated tool 1 according to the invention in the plane perpendicular to the thickness direction by the use of a field emission scanning electron microscope.

Hereinafter, examples of the coated tool according to the invention will be described now specifically.

EXAMPLES

The following powders, each having a mean particle size in a range of 2 to 4 μm, were prepared as raw materials: WC powder, TiC powder, ZrC powder, VC powder, TaC powder, NbC powder, $Cr_3C_2$ powder, TiN powder, TaN powder and Co powder. These raw powders were compounded with each other based on the compounding compositions shown in Table 1. Wax was added thereto, and the resultant was mixed in an acetone solution for 24 hours using a ball mill and was dried under a reduced pressure. Thereafter, the resultant powder mixture was press-formed in a green compact having a predetermined shape at a pressure of 98 MPa. The green compact was then sintered in a vacuum under the following conditions: a pressure of 5 Pa, a predetermined temperature in a range of 1370 to 1470° C., and a holding duration of 1 hour. After sintering, cutting edges were subjected to honing with R of 0.07 mm, thereby manufacturing tool substrates A to E made of WC-based cemented carbide and having throwaway tip shapes defined in ISO/CNMG120408.

In addition, the following powders, each having a mean particle size in a range of 0.5 to 2 μm, were prepared as raw materials: TiCN (TiC/TiN=50/50 in weight ratio) powder, Mo$_2$C power, ZrC power, NbC powder, TaC powder, WC power, Co powder, and Ni powder. Those raw powders were compounded with each other based on the compounding composition shown in Table 2, were wet-mixed with each other for 24 hours using a ball mill, and were dried. Thereafter, the resultant powder mixture was pressed at a pressure of 98 MPa to form a green compact. The green compact was then sintered in a nitrogen atmosphere under the following conditions: a pressure of 1.3 kPa, a temperature of 1540° C., and a holding duration of 1 hour. After sintering, cutting edges were subjected to honing with R of 0.07 mm, thereby manufacturing tool substrates a to e made of TiCN-based cermet and having tip shapes defined in ISO Standard CNMG120408.

Subsequently, tool substrates A to E and tool substrates a to e were set into a known chemical vapor deposition apparatus and the Ti compound layer as a lower layer of a hard-coating layer was formed with combinations and target thicknesses shown in Table 6 under conditions shown in Table 3 (in Table 3, 1-TiCN represents formation conditions of TiCN layers having a longitudinal-growth crystal structure described in JP-A-Hei 6-8010, and the others represent formation conditions of general granular crystal structure).

A reformed AlZrO layer as the upper layer of a hard-coating layer was formed with the target thicknesses shown in Table 6 under conditions shown in Table 4, thereby manufacturing coated tools 1 to 15 according to the invention.

For the purpose of comparison, the lower layer was formed by vapor deposition under the same conditions as coated tools 1 to 15 according to the invention and then the conventional AlZrO layer as the upper layer of the hard-coating layer was formed with combinations and target thicknesses shown in Table 7 under the conditions shown in Table 5, thereby manufacturing conventional coated tools 1 to 15.

Subsequently, the crystal grain structures and the constituent atom covalent lattice point types of the reformed AlZrO layers and the conventional AlZrO layers constituting the upper layers of the hard-coating layers of coated tools 1 to 15 according to the invention and conventional coated tools 1 to 15 were observed by the use of the field emission scanning electron microscope and the electron backscatter diffraction imaging device.

Figure 1B:
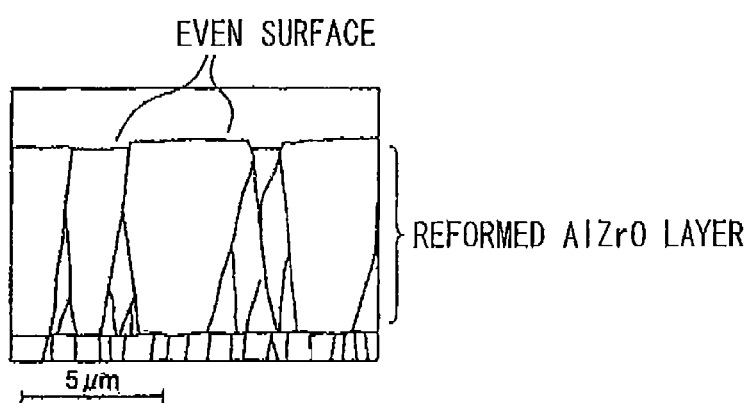
FIG. 1B is a diagram schematically illustrating a structure of crystal grains having an elongate shape in the thickness direction with an almost even surface, which is obtained by observing the upper layer in the plane parallel to the thickness direction by the use of the field emission scanning electron microscope.
Figure 1C:
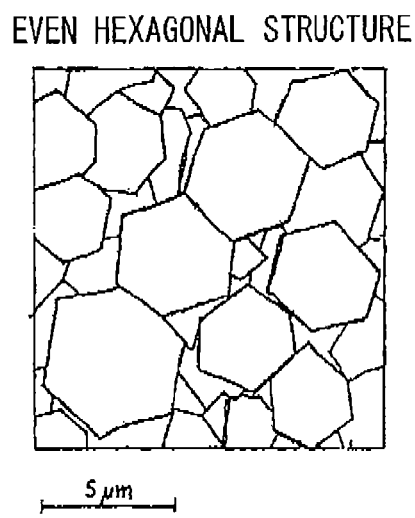
FIG. 1C is a diagram schematically illustrating a structure of even hexagonal crystal grains, which is obtained by observing the upper layer formed of the reformed AlZrO layer in a coated tool 11 according to the invention in the plane perpendicular to the thickness direction by the use of the field emission scanning electron microscope.

That is, the reformed AlZrO layers of coated tools 1 to 15 according to the invention and the conventional AlZrO layers of conventional coated tools 1 to 15 were first observed by the use of the field emission scanning electron microscope. In the coated tools according to the invention, the crystal grain structure having an even polygonal shape (including an even hexagonal shape) and an elongate shape with a large grain size representatively shown in FIGS. 1A and 1B was observed (where FIG. 1A is a diagram schematically illustrating a structure of coated tool 1 according to the invention in the plane perpendicular to the thickness direction and FIG. 1C is a diagram schematically illustrating a structure of the crystal grains having an even hexagonal shape and an elongate shape with a large grain size in coated tool 11 according to the invention in the plane perpendicular to the thickness direction).

Figure 2A:
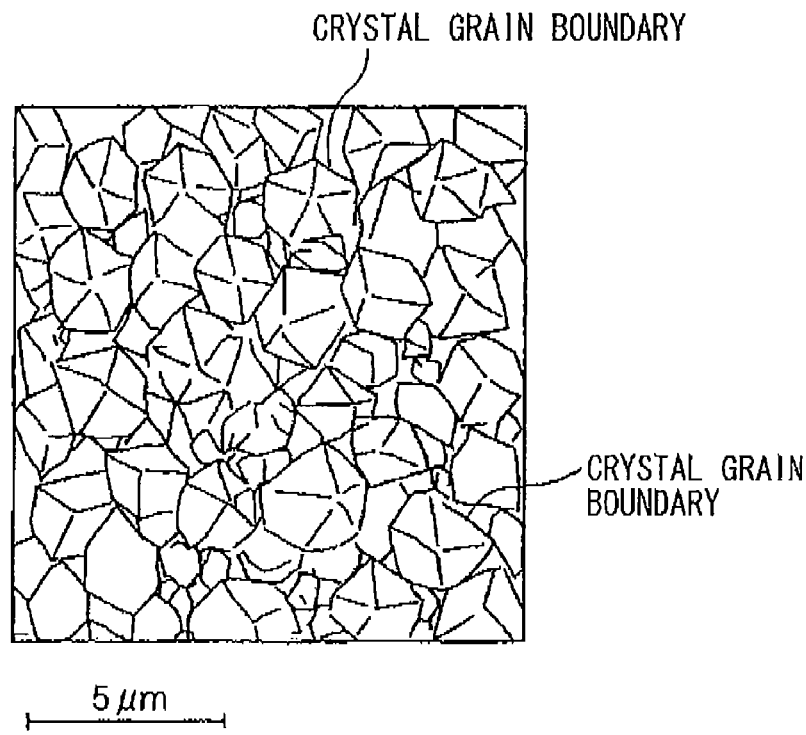
FIG. 2A is a diagram schematically illustrating a structure of polygonal crystal grains, which is obtained by observing an upper layer formed of a conventional AlZrO layer in conventional coated tool 1 in the plane perpendicular to the thickness direction by the use of the field emission scanning electron microscope
Figure 2B:
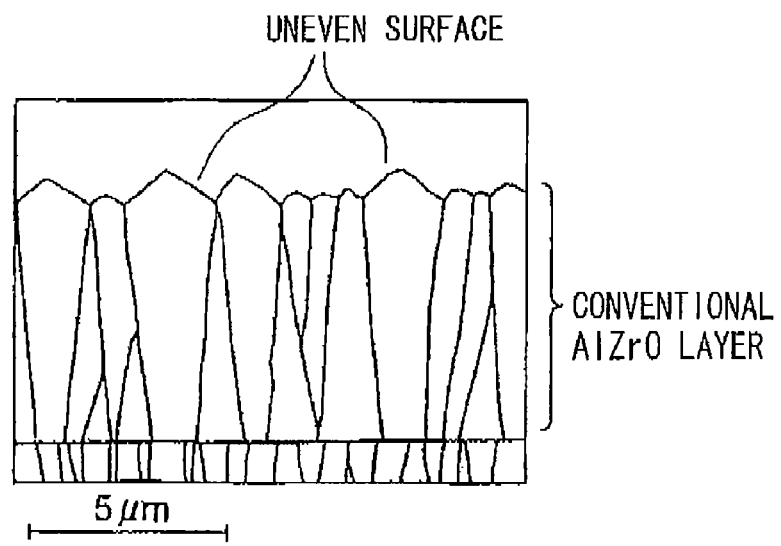
FIG. 2B is a diagram schematically illustrating a structure of crystal grains having an elongate shape in the thickness direction with pyramidal unevenness in the layer surface, which is obtained by observing the upper layer in the plane parallel to the thickness direction by the use of the field emission scanning electron microscope.
Figure 3:
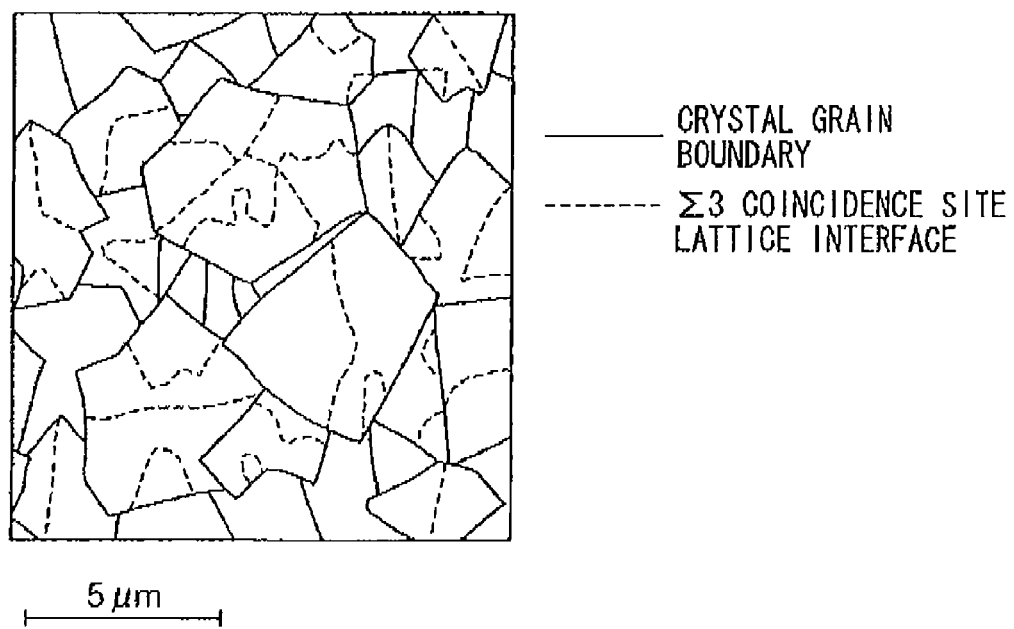
FIG. 3 is a grain boundary analysis diagram of the plane perpendicular to the thickness direction, which is obtained by observing the upper layer formed of the reformed AlZrO layer in coated tool 1 according to the invention by the use of the field emission scanning electron microscope and an electron backscatter diffraction imaging device, where a solid line represents an even polygonal crystal grain system observed by the use of the field emission scanning electron microscope and a broken line represents a Σ3 coincidence site lattice interface observed by the use of the electron backscatter diffraction imaging device.

In the conventional coated tools, the crystal grain structure having a polygonal and elongate shape was observed as representatively shown in FIGS. 2A and 2B. However, the grain sizes of the crystal grains were smaller than those of the invention and pyramidal unevenness was formed on the layer surfaces as can be clearly seen from FIG. 2B (where FIGS. 2A and 2B are diagrams schematically illustrating the structure of conventional coated tool 1).

The area ratio of the crystal grains having the Σ3 coincidence site lattice interface in the crystal grains of the layers was measured on the reformed AlZrO layers of coated tools 1 to 15 according to the invention and the conventional AlZrO layers of conventional coated tools 1 to 15.

First, the reformed AlZrO layers of coated tools 1 to 15 according to the invention were set into a tube of a field emission scanning electron microscope with the surfaces thereof set as a polished surface. Electron beams were radiated to the individual crystal grains having hexagonal crystal lattices existing within a measurable range of a polished surface, where the electron beams was applied at 70 degree about the polished surface with an acceleration voltage of 15 kV and application current of 1 nA. By the use of the electron backscatter diffraction imaging device, angles formed by normal lines of the crystal lattice faces of the crystal grains and the normal line of the polished surface were measured from 30×50 μm with an interval of 0.1 μm/step. A crystallographic orientation relationship between the adjacent crystal lattices was calculated from the measurement result and a distribution of lattice points (constituent atom covalent lattice points) in which the constituent atoms of a crystal lattice interface share one constituent atom between the crystal lattices was calculated. When a constituent atom covalent lattice point type in which N lattice points not sharing the constituent atom exist between the constituent atom covalent lattice points (where N is an even number of 2 or more in view of a crystal structure of corundum type hexagonal close packed crystal but does not include even numbers of 4, 8, 14, 24, and 26 when the upper limit of N is set to 28 in view of distribution frequency) is expressed as ΣN+1, the area ratio of the crystal gains having at least one Σ3 coincidence site lattice interface therein to the entire crystal grains within the measurable range of the reformed AlZrO layer was calculated and the values are shown in Table 6.

Then, in the conventional AlZrO layers of conventional coated tools 1 to 15, the area ratio of the crystal grains having at least one Σ3 coincidence site lattice interface in the crystal grains to the total crystal grains within the measurable range of the conventional AlZrO layer was calculated by the same method as the coated tools according to the invention, and the calculated values are shown in Table 7.

As shown in Tables 6 and 7, in the reformed AlZrO layers of the coated tools according to the invention, the area ratio of the crystal grains having the Σ3 coincidence site lattice interface was 60% or more. On the contrary, in the conventional AlZrO layers of the conventional coated tools, the area ratio of the crystal grains having the Σ3 coincidence site lattice interface was 40% or less. It can be seen from the table that the ratio of the crystal grains having the Σ3 coincidence site lattice interface is very small.

Then, the thicknesses of the constituent layers of the hard-coating layers of coated tools 1 to 15 according to the invention and conventional coated tools 1 to 15 were measured (in a longitudinal section) by the use of the scanning electron microscope. Substantially the same average thicknesses (average of five points measured) as the target thickness were obtained in all cases.

In the reformed AlZrO layers of coated tools 11 to 15 according to the invention, the area ratio of the crystal grains having an even hexagonal shape with a large grain size in the plane perpendicular to the thickness direction was measured by the field emission scanning electron microscope and the measured values are shown in Table 6.

The "even hexagonal shape with a large grain size" described in the invention is defined as a "polygonal shape having an 10 point average in the range of 3 to 8 μm and six vertexes having an angle in the range of 100° to 140° when the diameters of particles in the plane perpendicular to the thickness layer were measured by the use of the field emission scanning electron microscope."

Next, in a state in which each of coated tools 1 to 15 according to the invention and conventional coated tools 1 to 15 was fixed to a tip of a bite made of tool steel with a fixing jig, to the following tests were carried out:

A dry high-speed fast-feed cutting test of carbon steel (where normal cutting speed and feed rate are 250 m/min and 0.3 mm/rev, respectively) under the following cutting condition.

Cutting Condition A
  Workpiece: JIS S45C round bar
  Cutting speed: 450 m/min
  Depth of cut: 2.5 mm
  Feed rate: 0.7 mm/rev
  Cutting time: 8 min A day high-speed high-depth cutting test of chromium-molybdenum alloyed steel (where normal cutting speed and cutting depth are 250 m/min and 1.5 mm, respectively) was performed under the following cutting condition.

Cutting Condition B
  Workpiece: JIS SCM440 round bar
  Cutting speed: 320 m/min
  Depth of cut: 2.2 mm
  Feed rate: 0.3 mm/rev
  Cutting time: 5 min A wet high-speed high depth cutting test of cast iron (where normal cutting speed and cutting depth are 350 m/min and 2.5 mm, respectively) was performed under the following cutting condition.

Cutting Condition C
  Workpiece: JIS FC300 round bar
  Cutting speed: 545 m/min
  Depth of cut: 5.6 mm
  Feed rate: 0.6 mm/rev
  Cutting time: 5 min Then, the width of flank abrasion of a cutting edge was measured in each cutting test. The measurement results are shown in Table 8.

TABLE 1

| Type | | Co | TiC | ZrC | VC | TaC | NbC | $Cr_3C_2$ | TiN | TaN | WC |
|---|---|---|---|---|---|---|---|---|---|---|---|
| Tool Substrate | A | 7 | — | — | — | — | — | — | — | — | Balance |
| | B | 5.7 | — | — | — | 1.5 | 0.5 | — | 1.2 | — | Balance |
| | C | 5.7 | 2.3 | — | — | — | — | 1 | — | — | Balance |
| | D | 8.5 | — | 0.5 | — | — | — | 0.5 | — | — | Balance |
| | E | 12.5 | 2 | — | — | — | — | — | 1 | 2 | Balance |

TABLE 2

| | Type | Co | Ni | ZrC | TaC | NbC | $Mo_2C$ | WC | TiCN |
|---|---|---|---|---|---|---|---|---|---|
| Tool Substrate | a | 12 | 6 | — | 10 | — | 10 | 16 | Balance |
| | b | 7 | 7 | — | 5 | — | 7.5 | — | Balance |
| | c | 5 | — | — | — | 1 | 6 | 10 | Balance |
| | d | 9 | 6 | — | 11 | 2 | — | — | Balance |
| | e | 8 | 5 | 1 | 8 | — | 10 | 10 | Balance |

TABLE 3

Formation Conditions (Pressure of Reaction Atmosphere denotes kPa, and temperature thereof denotes ° C.)

| Lower Layer of Hard-coating layer | Reaction Gas Composition (volume %) | Reaction Atmosphere Pressure | Temperature |
|---|---|---|---|
| TiC | $TiCl_4$: 4.2%, $CH_4$: 8.5%, $H_2$: Balance | 7 | 1020 |
| TiN (First Layer) | $TiCl_4$: 4.2%, $N_2$: 30%, $H_2$: Balance | 30 | 900 |
| TiN (Other Layers) | $TiCl_4$: 4.2%, $N_2$: 35%, $H_2$: Balance | 50 | 1040 |
| l-$TiC_{0.5}N_{0.5}$ | $TiCl_4$: 4.2%, $N_2$: 20%, $CH_3CN$: 0.6%, $H_2$: Balance | 7 | 900 |
| TiCN | $TiCl_4$: 4.2%, $N_2$: 20%, $CH_4$: 4%, $H_2$: Balance | 12 | 1020 |
| TiCO | $TiCl_4$: 4.2%, CO: 4%, $H_2$: Balance | 7 | 1020 |
| TiCNO | $TiCl_4$: 4.2%, CO: 3%, $CH_4$: 3%, $N_2$: 20%, $H_2$: Balance | 20 | 1020 |

TABLE 4

| Reformed AlZrO layer | | Formation conditions (pressure of reaction atmosphere is denoted by kPa, temperature is denoted by ° C.) | | |
|---|---|---|---|---|
| Formation symbol | | Composition of reaction gas (volume %) | Reaction atmosphere pressure | temperature |
| A | First step | AlCl$_3$: 1%, HCl: 3%, CO$_2$: 2%, H$_2$S: 0.3%, H$_2$: balance | 6 | 1010 |
| | Second step | AlCl$_3$: 6%, ZrCl$_4$: 1.2%, HCl: 3%, CO$_2$: 5%, H$_2$S: 0.4%, H$_2$: balance | 6 | 950 |
| B | First step | AlCl$_3$: 2%, HCl: 4%, CO$_2$: 3%, H$_2$S: 0.25%, H$_2$: balance | 10 | 1000 |
| | Second step | AlCl$_3$: 7%, ZrCl$_4$: 1.0%, HCl: 4%, CO$_2$: 6%, H$_2$S: 0.3%, H$_2$: balance | 8 | 970 |
| C | First step | AlCl$_3$: 4%, HCl: 5%, CO$_2$: 4%, H$_2$S: 0.5%,, H$_2$: balance | 10 | 980 |
| | Second step | AlCl$_3$: 8%, ZrCl$_4$: 0.8%, HCl: 4%, CO$_2$: 6%, H$_2$S: 0.25%, H$_2$: balance | 10 | 920 |
| D | First step | AlCl$_3$: 5%, HCl: 1%, CO$_2$: 6%, H$_2$S: 0.75%,, H$_2$: balance | 9 | 960 |
| | Second step | AlCl$_3$: 10%, ZrCl$_4$: 0.6%, HCl: 3%, CO$_2$: 8%, H$_2$S: 0.6%, H$_2$: balance | 9 | 1000 |
| E | First step | AlCl$_3$: 2%, HCl: 2%, CO$_2$: 4%, H$_2$S: 0.6%,, H$_2$: balance | 8 | 980 |
| | Second step | AlCl$_3$: 9%, ZrCl$_4$: 0.9%, HCl: 5%, CO$_2$: 5%, H$_2$S: 0.25%, H$_2$: balance | 8 | 960 |
| F | First step | AlCl$_3$: 3%, HCl: 3%, CO$_2$: 5%, H$_2$S: 0.75%,, H$_2$: balance | 7 | 990 |
| | Second step | AlCl$_3$: 8%, ZrCl$_4$: 0.7%, HCl: 4%, CO$_2$: 4%, H$_2$S: 0.3%, H$_2$: balance | 7 | 970 |

TABLE 5

| Conventional AlZrO layer | | Formation conditions (pressure of reaction atmosphere is denoted by kPa, temperature is denoted by ° C.) | | |
|---|---|---|---|---|
| Formation symbol | | Composition of reaction gas (volume %) | Reaction atmosphere pressure | temperature |
| a | First step | AlCl$_3$: 2.3%, ZrCl$_4$: 0.13%, HCl: 2.0%, CO$_2$: 4%, H$_2$S: 0.2%, H$_2$: balance | 10 | 800 |
| | Second step | AlCl$_3$: 2.3%, ZrCl$_4$: 0.1%, HCl: 2.0%, CO$_2$: 7%, H$_2$S: 0.1%, H$_2$: balance | 6 | 1020 |
| b | First step | AlCl$_3$: 2.7%, ZrCl$_4$: 0.08%, HCl: 1.5%, CO$_2$: 5%, H$_2$S: 0.1%, H$_2$: balance | 8 | 750 |
| | Second step | AlCl$_3$: 2.7%, ZrCl$_4$: 0.13%, HCl: 1.5%, CO$_2$: 8%, H$_2$S: 0.2%, H$_2$: balance | 8 | 1030 |
| c | First step | AlCl$_3$: 3.5%, ZrCl$_4$: 0.05%, HCl: 2.5%, CO$_2$: 3%, H$_2$S: 0.15%, H$_2$: balance | 9 | 840 |
| | Second step | AlCl$_3$: 3.5%, ZrCl$_4$: 0.08%, HCl: 2.5%, CO$_2$: 5%, H$_2$S: 0.15%, H$_2$: balance | 9 | 1050 |
| d | First step | AlCl$_3$: 4%, ZrCl$_4$: 0.02%, HCl: 3.0%, CO$_2$: 1%, H$_2$S: 0.05%, H$_2$: balance | 6 | 900 |
| | Second step | AlCl$_3$: 4%, ZrCl$_4$: 0.02%, HCl: 3.0%, CO$_2$: 3%, H$_2$S: 0.05%, H$_2$: balance | 10 | 1040 |

TABLE 6

| | | | Hard-coating layer Lower layer [Ti compound layer] | | | |
|---|---|---|---|---|---|---|
| Type | | Tool Substrate Symbol | First Layer (μm) | Second Layer (μm) | Third Layer (μm) | Fourth Layer (μm) |
| Coated tool according to the invention | 1 | a | TiN (1) | 1-TiCN (17.5) | TiN (1) | TiCNO (0.5) |
| | 2 | A | TiCN (1) | 1-TiCN (8.5) | TiCO (0.5) | — |
| | 3 | b | TiN (1) | 1-TiCN (4) | TiC (4) | TiCNO (1) |
| | 4 | B | TiC (1) | 1-TiCN (9) | — | — |
| | 5 | c | TiN (1) | 1-TiCN (4.5) | TiCNO (0.5) | — |
| | 6 | C | TiN (0.5) | 1-TiCN (1.5) | TiC (0.5) | TiCNO (0.5) |
| | 7 | d | TiN (0.5) | 1-TiCN (10) | TiC (2) | TiCNO (0.3) |
| | 8 | D | TiN (1) | TiCN (19) | — | — |
| | 9 | e | TiC (0.5) | 1-TiCN (9) | TiCO (0.5) | — |
| | 10 | E | TiN (1) | TiC (1) | TiCN (7) | TiCO (1) |
| | 11 | A | TiN (0.3) | 1-TiCN (5) | TiCNO (0.7) | TiCO (0.1) |
| | 12 | a | TiN (1) | 1-TiCN (10) | TiCO (0.5) | — |
| | 13 | B | TiN (0.5) | 1-TiCN (12) | TiN (0.5) | TiCNO (0.2) |
| | 14 | b | TiN (0.6) | 1-TiCN (7) | TiCNO (0.3) | — |
| | 15 | c | TiN (0.4) | 1-TiCN (3) | TiCN (0.5) | TiCO (0.1) |

TABLE 6-continued

| | | | Hard-coating layer | | |
|---|---|---|---|---|---|
| | | | Upper layer [reformed AlZrO layer] | | |
| Type | | Upper layer formation symbol | Content of Zr [Zr/(Al + Zr)] (atomic ratio) | Target thickness (μm) | Ratio of crystal grains having Σ3 coincidence site lattice interface (area %) | Area ration of even hexagonal crystal grains (area %) |
| Coated tool according to the invention | 1 | A | 0.01 | 2 | 60 | 0 |
| | 2 | C | 0.004 | 15 | 84 | 20 |
| | 3 | B | 0.006 | 8 | 77 | 15 |
| | 4 | D | 0.002 | 7 | 73 | 18 |
| | 5 | A | 0.008 | 9 | 80 | 16 |
| | 6 | D | 0.003 | 11 | 86 | 7 |
| | 7 | B | 0.005 | 13 | 90 | 25 |
| | 8 | C | 0.004 | 4 | 64 | 10 |
| | 9 | A | 0.007 | 5 | 62 | 0 |
| | 10 | B | 0.006 | 12 | 88 | 5 |
| | 11 | E | 0.005 | 5 | 72 | 35 |
| | 12 | F | 0.004 | 7 | 83 | 57 |
| | 13 | F | 0.003 | 6 | 89 | 73 |
| | 14 | E | 0.005 | 8 | 78 | 80 |
| | 15 | F | 0.004 | 10 | 74 | 62 |

(NUMERAL IN BRACKET IN LOWER LAYER MEANS TARGET THICKNESS)

TABLE 7

| | | | Hard-coating layer | | | | | | |
|---|---|---|---|---|---|---|---|---|---|
| | | | Lower layer [Ti compound layer] | | | | Upper | Upper layer [conventional AlZrO layer] | | |
| Type | | Tool Substrate Symbol | First layer (μm) | Second layer (μm) | Third layer (μm) | Fourth layer (μm) | layer formation symbol | Content of Zr [Zr/(Al + Zr)] (atomic ratio) | Target thickness (μm) | Ratio of crystal grains having Σ3 coincidence site lattice interface (area %) |
| Conventional coated tool | 1 | The same as coated tool 1 according the invention | | | | | a | 0.04 | 3 | 6 |
| | 2 | The same as coated tool 2 according the invention | | | | | b | 0.02 | 14 | 38 |
| | 3 | The same as coated tool 3 according the invention | | | | | c | 0.009 | 10 | 35 |
| | 4 | The same as coated tool 4 according the invention | | | | | d | 0.003 | 9 | 21 |
| | 5 | The same as coated tool 5 according the invention | | | | | c | 0.008 | 8 | 17 |
| | 6 | The same as coated tool 6 according the invention | | | | | d | 0.004 | 12 | 8 |
| | 7 | The same as coated tool 7 according the invention | | | | | a | 0.05 | 15 | 12 |
| | 8 | The same as coated tool 8 according the invention | | | | | b | 0.01 | 6 | 7 |
| | 9 | The same as coated tool 9 according the invention | | | | | a | 0.05 | 2 | 2 |
| | 10 | The same as coated tool 10 according the invention | | | | | b | 0.015 | 7 | 5 |
| | 11 | The same as coated tool 11 according the invention | | | | | c | 0.008 | 5 | 20 |
| | 12 | The same as coated tool 12 according the invention | | | | | d | 0.004 | 8 | 18 |
| | 13 | The same as coated tool 13 according the invention | | | | | a | 0.06 | 11 | 15 |
| | 14 | The same as coated tool 14 according the invention | | | | | c | 0.007 | 4 | 10 |
| | 15 | The same as coated tool 15 according the invention | | | | | d | 0.003 | 7 | 9 |

TABLE 8

| | | Width of Flank abrasion (mm) | | | | | Cutting Test Result (min) | | |
|---|---|---|---|---|---|---|---|---|---|
| Type | | Cutting condition A | Cutting condition B | Cutting condition C | Type | | Cutting condition A | Cutting condition B | Cutting condition C |
| Coated Tool of the Invention | 1 | 0.43 | 0.41 | 0.38 | Conventional Coated Tool | 1 | 2.0* | 0.8* | 1.0* |
| | 2 | 0.42 | 0.42 | 0.43 | | 2 | 6.5* | 3.2* | 3.6* |
| | 3 | 0.21 | 0.18 | 0.20 | | 3 | 6.0 | 3.0 | 3.5 |
| | 4 | 0.20 | 0.19 | 0.22 | | 4 | 6.2 | 2.8 | 3.2 |
| | 5 | 0.19 | 0.20 | 0.18 | | 5 | 6.5 | 3.2 | 3.4 |
| | 6 | 0.25 | 0.26 | 0.24 | | 6 | 5.0* | 2.2* | 2.5* |
| | 7 | 0.26 | 0.25 | 0.27 | | 7 | 4.8* | 2.4* | 2.2* |
| | 8 | 0.34 | 0.33 | 0.32 | | 8 | 4.0 | 2.0 | 2.3 |
| | 9 | 0.33 | 0.31 | 0.30 | | 9 | 2.8 | 1.0 | 1.5 |
| | 10 | 0.27 | 0.28 | 0.27 | | 10 | 2.5 | 1.5 | 1.8 |
| | 11 | 0.16 | 0.16 | 0.15 | | 11 | 3.0 | 2.5 | 3.2* |
| | 12 | 0.12 | 0.13 | 0.13 | | 12 | 3.2 | 2.0 | 3.0 |
| | 13 | 0.13 | 0.12 | 0.11 | | 13 | 3.0* | 1.8* | 2.5 |

TABLE 8-continued

| Type | Width of Flank abrasion (mm) | | | Type | Cutting Test Result (min) | | |
|---|---|---|---|---|---|---|---|
| | Cutting condition A | Cutting condition B | Cutting condition C | | Cutting condition A | Cutting condition B | Cutting condition C |
| 14 | 0.10 | 0.11 | 0.12 | 14 | 2.2 | 1.2 | 2.0* |
| 15 | 0.11 | 0.12 | 0.11 | 15 | 2.6 | 1.5 | 2.0* |

The cutting test result of the conventional coated tools indicates the cutting time (minutes) until the lifetime due to chipping or flank abrasion (Lifetime criterion: width of flank abrasion of 0.5 mm).
Mark * indicates that the lifetime expires due to the chipping.

The following can be seen from Tables 6 to 8. In the coated tool according to the invention, the aluminum oxide layer (the reformed AlZrO layer) constituting the upper layer has the structure of the crystal grains having an even polygonal (even hexagonal) and elongate shape and the area ratio of the crystal grains having one or more Σ3 coincidence site lattice interface therein is high. Accordingly, in addition to the high-temperature hardness, the high-temperature strength, and the heat resistance of the conventional AlZrO layer of the convention coated tool, the coated tool according to the invention exhibits excellent surface evenness and excellent high-temperature strength. As a result, the hard-coating layer exhibits excellent chipping resistance, breakage resistance, and peeling resistance and excellent abrasion resistance even during high-speed heavy cutting of steel, cast iron, etc. in which high-temperature heat is emitted and a heavy load is applied to the cutting edges, thereby further elongating the usable lifetime. On the contrary, in conventional coated tools 1 to 15 having the conventional AlZrO layer as the upper layer of the hard-coating layer, the high-temperature strength is not sufficient to promote the abrasion under the high-speed heavy cutting conditions and thus the usable lifetime is shortened.

As described above, in the coated tool according to the invention, the hard-coating layer exhibits the excellent chipping resistance, breakage resistance, and peeling resistance and the excellent abrasion resistance even during a high-speed heavy cutting work in which high-temperature heat is emitted and a heavy load is applied to the cutting edges, as well as a cutting work on steel, cast iron, etc. under the normal conditions, thereby providing excellent cutting performance for a long time. Accordingly, it is possible to satisfactorily cope with the enhancement in performance of the cutting tool, the labor saving and energy saving of the cutting work, and the decrease in cost.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A surface-coated cutting tool that is formed by coating a surface of a tool substrate made of tungsten-carbide-based cemented carbide or titanium-carbonitride-based cermet with a hard-coating layer including the following upper and lower layers (a) and (b) by vapor deposition:

(a) as the lower layer, a titanium compound layer having one or more of a titanium carbide layer, a titanium nitride layer, a titanium carbonitride layer, a titanium carboxide layer and a titanium oxycarbonitride layer with a total average layer thickness of 3 to 20 μm, and (b) as the upper layer, an aluminum oxide layer having an α-type crystal structure and containing Zr with an average layer thickness of 2 to 15 μm, wherein when the tipper layer is observed with a field emission scanning electron microscope, the upper layer has a structure including crystal grains having an even polygonal shape in a plane perpendicular to the thickness direction and an elongate shape in the thickness direction in a plane parallel to the thickness direction, and wherein when electron beams are radiated to the individual crystal grains existing within a measurable range of a polished surface by the use of a field emission scanning electron microscope and an electron backscatter diffraction imaging device to measure angles formed by normal lines of crystal lattice faces with hexagonal crystal lattices and the normal line of the polished surface, a crystallographic orientation relationship between the adjacent crystal lattices is calculated from the measurement result, a distribution of lattice points (constituent atom covalent lattice points) in which constituent atoms of a crystal lattice interface share one constituent atom between the crystal lattices is calculated, and a constituent atom covalent lattice point type in which N lattice points not sharing the constituent atom exist between the constituent atom covalent lattice points (where N is an even number of 2 or more in view of a crystal structure of corundum type hexagonal close packed crystal but does not include even numbers of 4, 8, 14, 24, and 26 when the upper limit of N is set to 28 in view of distribution frequency) is expressed as ΣN+1, the above mentioned crystal grains of which insides are divided by at least one crystal lattice interface with the constituent atom covalent lattice point type expressed by Σ3 occupying 60% or more as an area ratio in the crystal grains of the upper layer.

2. The surface-coated cutting tool according to claim 1, wherein when the upper layer (b) is observed with the field emission scanning electron microscope, the crystal grains having an even hexagonal shape in a plane perpendicular to the thickness direction and an elongate shape in the thickness direction in a plane parallel to the thickness direction occupies 35% or more as an area ratio in the entire plane perpendicular to the thickness direction.

* * * * *